United States Patent
Lu (10) Patent No.: US 12,185,551 B2
(45) Date of Patent: Dec. 31, 2024

(54) METHODS FOR FORMING FERROELECTRIC MEMORY DEVICES

(71) Applicant: WUXI SMART MEMORIES TECHNOLOGIES CO., LTD., Wuxi (CN)

(72) Inventor: Zhenyu Lu, Boise, ID (US)

(73) Assignee: WUXI SMART MEMORIES TECHNOLOGIES CO., LTD., Wuxi (CN)

( * ) Notice: Subject to any disclaimer, the term of this patent is extended or adjusted under 35 U.S.C. 154(b) by 294 days.

(21) Appl. No.: 17/074,518

(22) Filed: Oct. 19, 2020

(65) Prior Publication Data
US 2021/0035994 A1 Feb. 4, 2021

Related U.S. Application Data

(62) Division of application No. 16/450,919, filed on Jun. 24, 2019, now Pat. No. 10,861,862.

(51) Int. Cl.
*H01L 21/28* (2006.01)
*H01L 29/51* (2006.01)
(Continued)

(52) U.S. Cl.
CPC .............. *H10B 53/20* (2023.02); *H10B 53/10* (2023.02); *G11C 11/221* (2013.01);
(Continued)

(58) Field of Classification Search
CPC ........... H01L 21/8239; H01L 27/11504; H01L 27/11507; H01L 27/11514;
(Continued)

(56) References Cited

U.S. PATENT DOCUMENTS 6,184,927 B1  2/2001  Kang
6,204,158 B1  3/2001  Hendrix et al.
(Continued)

FOREIGN PATENT DOCUMENTS

CN  101017879 A  8/2007
CN  106463513 A  2/2017
(Continued)

OTHER PUBLICATIONS

International Search Report issued in corresponding International Application No. PCT/CN2020/072927, mailed Apr. 24, 2020, 4 Pages.
(Continued)

*Primary Examiner* — Meiya Li
(74) *Attorney, Agent, or Firm* — Bayes PLLC (57) ABSTRACT

Embodiments of ferroelectric memory devices and methods for forming the ferroelectric memory devices are disclosed. In an example, a method of forming a ferroelectric memory cell is disclosed. A first electrode is formed. A doped ferroelectric layer is formed in contact with the first electrode. The doped ferroelectric layer includes oxygen and one or more ferroelectric metals. The doped ferroelectric layer further includes a plurality of dopants including at least one dopant from one of Group II elements, Group III elements, or Lanthanide elements. The plurality of dopants are different from the one or more ferroelectric metals. A second electrode is formed in contact with the doped ferroelectric layer.

20 Claims, 8 Drawing Sheets

(51) Int. Cl.
  *H10B 53/10*  (2023.01)
  *H10B 53/20*  (2023.01)
  *G11C 11/22*  (2006.01)
  *H10B 51/10*  (2023.01)
  *H10B 51/20*  (2023.01)

(52) U.S. Cl.
  CPC ....... *H01L 29/40111* (2019.08); *H01L 29/516* (2013.01); *H10B 51/10* (2023.02); *H10B 51/20* (2023.02)

(58) Field of Classification Search
  CPC ......... H01L 27/11587; H01L 27/11597; H01L 28/40; H01L 29/40111; H01L 29/516
  See application file for complete search history.

(56) References Cited

U.S. PATENT DOCUMENTS

| | | | |
|---|---|---|---|
| 6,350,643 | B1 | 2/2002 | Hintermaier et al. |
| 7,029,984 | B2 | 4/2006 | Horii et al. |
| 7,247,504 | B2 | 7/2007 | Matsuura et al. |
| 7,312,091 | B2 | 12/2007 | Lee et al. |
| 7,585,683 | B2 | 9/2009 | Im et al. |
| 8,344,434 | B2 | 1/2013 | Wang et al. |
| 9,773,788 | B1* | 9/2017 | Juengling ........... H01L 29/7841 |
| 2001/0018221 | A1 | 8/2001 | Takasu et al. |
| 2003/0062553 | A1 | 4/2003 | Ramesh et al. |
| 2003/0201475 | A1 | 10/2003 | Uchiyama et al. |
| 2004/0121217 | A1* | 6/2004 | Herman .............. H01M 4/8626 429/456 |
| 2007/0190670 | A1 | 8/2007 | Forest |
| 2009/0057737 | A1* | 3/2009 | Boescke ................ H01L 28/91 257/295 |
| 2009/0127603 | A1 | 5/2009 | Yamakawa et al. |
| 2013/0130407 | A1 | 5/2013 | Wang |
| 2017/0103988 | A1 | 4/2017 | Nishida et al. |
| 2017/0148512 | A1 | 5/2017 | Karda et al. |
| 2018/0331113 | A1* | 11/2018 | Liao ........................ H01L 28/55 |
| 2019/0252612 | A1* | 8/2019 | Tortorelli ................ H01L 45/08 |

FOREIGN PATENT DOCUMENTS

| | | |
|---|---|---|
| CN | 108520878 A | 9/2018 |
| TW | 201830663 A | 8/2018 |
| TW | I657569 B | 4/2019 |
| WO | 2015066129 A1 | 5/2015 |

OTHER PUBLICATIONS

Written Opinion of the International Search Authority issued in corresponding International Application No. PCT/CN2020/072927, mailed Apr. 24, 2020, 5 Pages.

* cited by examiner

METHODS FOR FORMING FERROELECTRIC MEMORY DEVICES

CROSS REFERENCE TO RELATED APPLICATION

This application is division of U.S. application Ser. No. 16/450,919, filed on Jun. 24, 2019, entitled "FERROELECTRIC MEMORY DEVICES," which is hereby incorporated by reference in its entirety.

BACKGROUND

Embodiments of the present disclosure relate to ferroelectric memory devices and fabrication methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of ferroelectric memory devices and fabrication methods thereof are disclosed herein.

In one example, a ferroelectric memory cell includes a first electrode, a second electrode, a doped ferroelectric layer disposed between the first electrode and the second electrode. The doped ferroelectric layer includes oxygen and one or more ferroelectric metals. The doped ferroelectric layer further includes a plurality of dopants including at least one dopant from one of Group II elements, Group III elements, or Lanthanide elements. The plurality of dopants are different from the one or more ferroelectric metals.

In some embodiments, the plurality of dopants are distributed along a concentration gradient from a first level of the doped ferroelectric layer to a second level of the ferroelectric layer. In some embodiments, the dopant concentrations of the first level and the second level are different. In some embodiments, the dopant concentrations of the first level and the second level are the same.

In some embodiments, the first level and the second level are each a respective one of surfaces in contact with the first electrode and the second electrode.

In some embodiments, the plurality of dopants include a first group of dopants and a second group of dopants. In some embodiments, the first group of dopants include at least one dopant from Group IV elements, and the second group of dopants include at least one dopant from one or more of Group V elements, Group II elements, Group III elements, or Lanthanide elements. In some embodiments, the first group of dopants include at least one of zirconium (Zr), hafnium (Hf), titanium (Ti), or silicon (Si), and the second group of dopants include at least one of tantalum (Ta), niobium (Nb), dubnium (Db), vanadium (V), scandium (Sc), yttrium (Y), aluminum (Al), gallium (Ga), indium (In), lanthanides, calcium (Ca), strontium (Sr), or barium (Ba). In some embodiments, a molar ratio between the first group of dopants and the second group of dopants is between about 100:1 and about 1:100.

In some embodiments, the plurality of dopants include a first group of dopants and a second group of dopants. In some embodiments, the first group of dopants include at least one dopant from Group V elements, and the second group of dopants comprise at least one dopant from one or more of Group II elements, Group III elements, or Lanthanide elements. In some embodiments, the first group of dopants comprise at least one of Ta, Nb, Db, or V, and the second group of dopants comprise at least one of Sc, Y, Al, Ga, In, lanthanides, Ca, Sr, or Ba. In some embodiments, a molar ratio between the first group of dopants and the second group of dopants is between about 100:1 and about 1:100.

In some embodiments, the plurality of dopants include a first group of dopants and a second group of dopants. In some embodiments, the first group of dopants include at least one dopant from Group III elements or Lanthanide elements, and the second group of dopants include at least one dopant from one or more of Group II elements. In some embodiments, the first group of dopants include at least one of Sc, Y, Al, Ga, In, or lanthanides, and the second group of dopants include at least one of Ca, Sr, or Ba. In some embodiments, a molar ratio between the first group of dopants and the second group of dopants is between about 100:1 and about 1:100.

In some embodiments, the first level and the second level are each a respective one of a middle level of the doped ferroelectric layer and a surface in contact with one of the first electrode and the second electrode.

In some embodiments, the first level includes a surface in contact with one of the first electrode and the second electrode and a first middle level of the doped ferroelectric layer. A dopant concentration at the surface may be the same as or different from a dopant concentration at the middle level. In some embodiments, the second level includes another middle level of the doped ferroelectric layer between the surface and the middle level. A dopant concentration at the other middle level may be the same as or different from the dopant concentration at surface and may be the same as or different from the dopant concentration at the middle level.

In some embodiments, the first level includes another middle level of the doped ferroelectric layer between a surface in contact with one of the first electrode and the second electrode and a middle level of the doped ferroelectric layer. A dopant concentration at the other middle level may be the same as or different from a dopant concentration at surface and being the same as or different from a dopant concentration at the middle level. In some embodiments, the second level includes the surface and the middle level of the doped ferroelectric layer. The dopant concentration at the surface may be the same as or different from the dopant concentration at the middle level.

In some embodiments, the plurality of dopants are distributed along a plurality of concentration gradients along a direction perpendicular to a surface of the doped ferroelectric layer. The plurality of concentration gradients may each extend from a first level of the doped ferroelectric layer to a second level of the doped ferroelectric layer. The first level of each of the plurality of concentration gradients may be the same as or different from one another, and the second level of each of the plurality of concentration gradients may be the same as or different from one another. In some embodiments, each of the first electrode and the second electrode comprises at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), ruthenium oxide (RuOx), iridium (Ir), doped polysilicon, transparent conductive oxides (TCO), or iridium oxide (IrOx).

In some embodiments, the first and/or or the second electrode includes a transparent conductive oxide (TCO). TCOs include, but are not limited to, doped ZnO based TCOs, doped $TiO_2$ based TCOs, doped $SnO_2$ based TCOs, and perovskite TCOs. In some embodiments, the first or the second electrode includes $La_{1-x}Sr_xCrO_3$ (LSCO).

In another example, a ferroelectric memory device includes a substrate and a plurality of ferroelectric memory strings extending vertically above the substrate. Each of the ferroelectric memory strings includes a conductor layer, a first electrode, a doped ferroelectric layer, and a second electrode layer disposed radially from a center of the ferroelectric memory string in this order. The doped ferroelectric layer includes oxygen and one or more ferroelectric metals. The doped ferroelectric layer further includes a plurality of dopants including at least one dopant from one of Group II elements, Group III elements, or Lanthanide elements. The plurality of dopants are different from the one or more ferroelectric metals.

In some embodiments, the plurality of dopants include a first group of dopants and a second group of dopants, distributed along a concentration gradient from one of the first electrode and the second electrode to the other one of the first electrode and the second electrode. In some embodiments, the first group of dopants include at least one of zirconium (Zr), hafnium (Hf), titanium (Ti), or silicon (Si), and the second group of dopants comprise at least one of tantalum (Ta), niobium (Nb), dubnium (Db), vanadium (V), scandium (Sc), yttrium (Y), aluminum (Al), gallium (Ga), indium (In), lanthanides, calcium (Ca), strontium (Sr), or barium (Ba). In some embodiments, a molar ratio between the first group of dopants and the second group of dopants is between about 100:1 and about 1:100.

In some embodiments, the plurality of dopants include a first group of dopants and a second group of dopants, distributed along a concentration gradient from one of the first electrode and the second electrode to the other one of the first electrode and the second electrode. In some embodiments, the first group of dopants include at least one of Ta, Nb, Db, or V, and the second group of dopants include at least one of Sc, Y, Al, Ga, In, lanthanides, Ca, Sr, or Ba. In some embodiments, a molar ratio between the first group of dopants and the second group of dopants is between about 100:1 and about 1:100.

In some embodiments, the plurality of dopants include a first group of dopants and a second group of dopants, distributed along a concentration gradient from one of the first electrode and the second electrode to the other one of the first electrode and the second electrode. In some embodiments, the first group of dopants include at least one of Sr, Y, Al, Ga, In, or lanthanides, and the second group of dopants include at least one of Ca, Sr, or Ba. In some embodiments, a molar ratio between the first group of dopants and the second group of dopants is between about 100:1 and about 1:100.

In yet another example, a method of forming a ferroelectric memory cell is disclosed. A first electrode is formed. A doped ferroelectric layer is formed in contact with the first electrode. The doped ferroelectric layer includes oxygen and one or more ferroelectric metals. The doped ferroelectric layer further includes a plurality of dopants comprising at least one dopant from one of Group II elements, Group III elements, or Lanthanide elements. The plurality of dopants are different from the one or more ferroelectric metals. A second electrode is formed in contact with the doped ferroelectric layer.

In some embodiments, forming the doped ferroelectric layer includes at least one of an in-situ doping process, an ion implantation process, a thermal diffusion process, or a plasma doping process. In some embodiments, an in-situ doping process includes, but no limited to, a chemical vapor deposition (CVD) process, a pulsed laser deposition (PLD) process, an atomic layer deposition (ALD) process, a sol-gel process, a metal-organic CVD (MOCVD) process, or a chemical solution deposition (CSD) process. In some embodiments, the in-situ doping process is performed in-situ in a same process chamber where the ferroelectric layer is formed. In some embodiments, an ion implantation process, a thermal diffusion process, a plasma doping process, or a combination thereof is performed to dope the plurality of dopants into the ferroelectric layer after the ferroelectric layer is deposited.

In some embodiments, forming the ferroelectric layer includes performing at least one of a chemical vapor deposition (CVD), a pulsed laser deposition (PLD), an atomic layered deposition (ALD), a sol-gel process, a metal-organic chemical vapor deposition (MOCVD), or a chemical solution deposition (CSD).

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings") on a laterally-oriented substrate so that the memory strings extend in the vertical direction with respect to the substrate. As used herein, the term "vertical/vertically" means nominally perpendicular to the lateral surface of a substrate.

One major limitation of existing ferroelectric memory devices is the relatively small memory cell density compared with other types of memory devices, which is in part, due to the fact that the ferroelectric materials tend to stop being ferroelectric when their dimensions shrink, for example, below the threshold crystallization (ferroelectric phase formation) thickness. This effect is related to the ferroelectric's depolarization field, which can cause the ferroelectric materials to lose their orthorhombic crystalline structures and thus, fail to crystalline regardless of the post annealing conditions.

Various embodiments in accordance with the present disclosure provide a ferroelectric memory device having an array of ferroelectric memory cells therein with smaller die size, higher film quality, higher device density, and improved performance compared with other ferroelectric memory devices. By using a doped ferroelectric layer having a plurality of groups of dopants distributed along a concentration gradient, the high dielectric constant (high-K) ferroelectric film crystallization can be boosted with various significant advantages. First, structural defects in the doped ferroelectric layer during the crystallization process can be compensated and reduced by the dopants. Second, remnant polarization, which is a measure of the polarization remaining in the material when the electric field is totally removed, can be increased, for example, by more than 30%. Further, threshold crystallization can be decreased, for example, below 5 nm, which can significantly shrink the memory cell dimension, thereby increasing the memory cell array density. By significantly enhancing the orthorhombic phase using the doped structure, ferroelectric properties can be achieved with the doped ferroelectric layer at a much thinner thickness, e.g., below 5 nm. For example, binary dopants added into the ferroelectric layer will be elastic during crystallization distortion, which improves high-k ferroelectric phase formation. In some embodiments, the doped ferroelectric layer can be formed in high aspect-ratio trench capacitors, such as in 3D memory devices.

Figure 1:
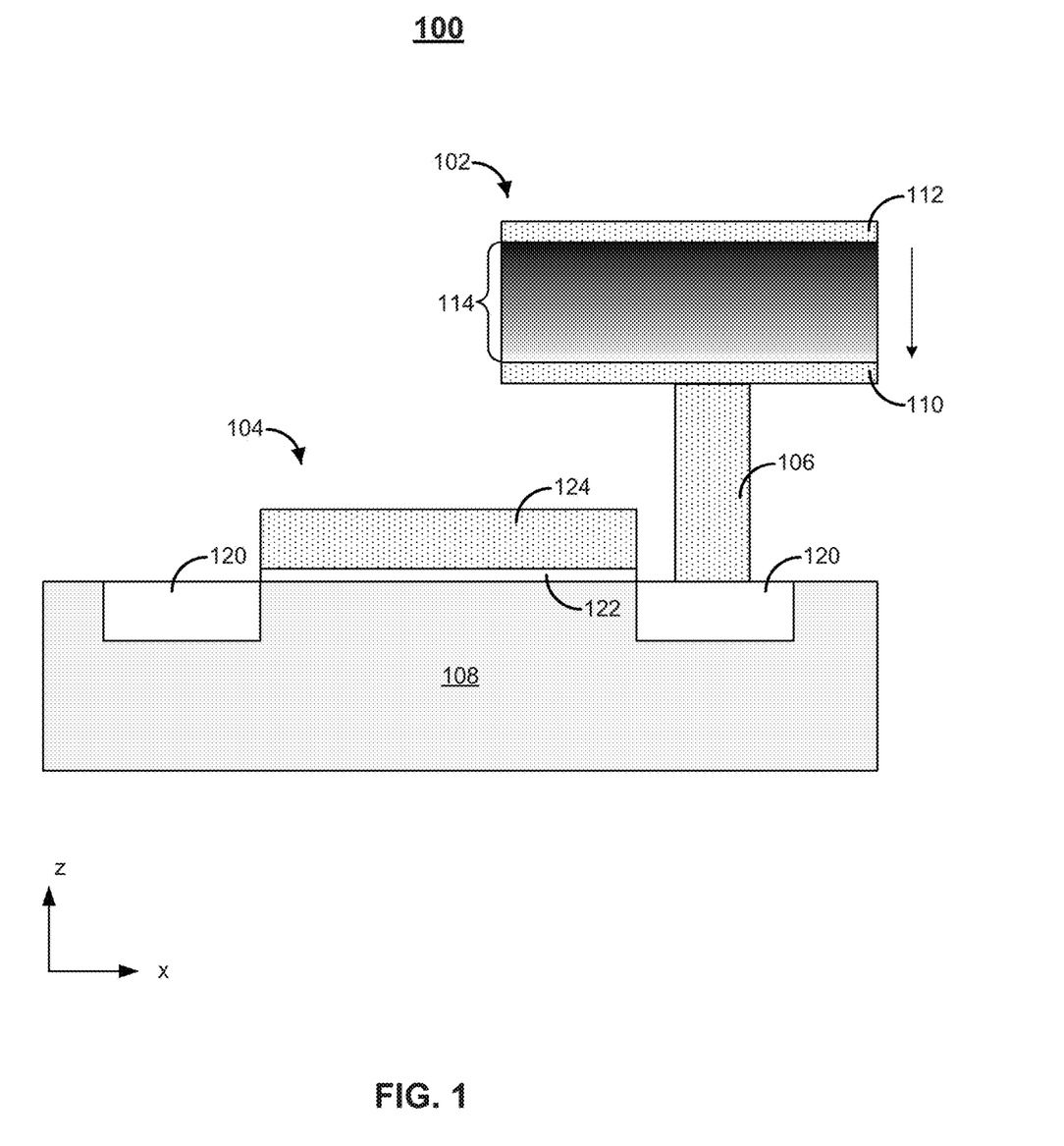
FIG. 1 illustrates a cross-section of an exemplary ferroelectric memory cell with a doped ferroelectric layer, according to some embodiments of the present disclosure.

FIG. 1 illustrates a cross-section of an exemplary ferroelectric memory cell 100, according to some embodiments of the present disclosure. Ferroelectric memory cell 100 is the storage element of a ferroelectric memory device and can include various designs and configurations. As shown in FIG. 1, ferroelectric memory cell 100 is a "1T-1C" cell that includes a capacitor 102, a transistor 104, and an interconnect 106 between capacitor 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

In some embodiments, capacitor 102 includes a lower electrode 110, an upper electrode 112, and a doped ferroelectric layer 114 disposed vertically between lower electrode 110 and upper electrode 112. Doped ferroelectric layer 114 may be in contact with and electrically connected to lower electrode 110 on a lower surface, and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to doped ferroelectric layer 114. For ease of description, the example of a 1T-1C cell is illustrated in the present disclosure. In various embodiments, doped ferroelectric layer 114 can be used in any other suitable types of memory cells with more than one capacitor per cell. For example, doped ferroelectric layer 114 can also be used in a "2T-2C" cell or a "nT-mC" (where n and m are integers) cell. The type of memory cells (e.g., the number of capacitors in a single memory cell) should not be limited by the embodiments of the present disclosure.

The materials of lower electrode 110 and upper electrode 112 can include, but not limited to, at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), ruthenium oxide (RuOx), iridium (Ir), doped polysilicon, transparent conductive oxides (TCO), or iridium oxide (IrOx).

In some embodiments, the first and/or or the second electrode includes a TCO, which includes, but are not limited to, doped ZnO based TCOs, doped $TiO_2$ based TCOs, doped $SnO_2$ based TCOs, and perovskite TCOs. In some embodiments, the first and/or the second electrode includes $La_{1-x}Sr_xCrO_3$ (LSCO).

In some embodiments, lower electrode 110 and upper electrode 112 include the same material(s). In some embodiments, lower electrode 110 and upper electrode 112 include different materials. The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, doped ferroelectric layer 114 includes a ferroelectric oxide material doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, doped ferroelectric layer 114 can include more than one ferroelectric layer.

The ferroelectric oxide material can include a ferroelectric composite oxide. In some embodiments, the ferroelectric oxide material includes oxygen and one or more ferroelectric metals. The ferroelectric metals can include, but not limited to, zirconium (Zr), hafnium (Hf), and titanium (Ti). In some embodiments, the ferroelectric metals also include aluminum (Al), nickel (Ni), and/or iron (Fe). In some embodiments, the ferroelectric oxide material includes $HfO_x$. In some embodiments, the ferroelectric oxide material includes oxygen and two or more ferroelectric metals. The molar ratio between two of the ferroelectric metals is between 0.1 and 10 (e.g., 0.1, 0.2, 0.3, 0.4, 0.5, 0.6, 0.7, 0.8, 0.9, 1, 2, 3, 4, 5, 6, 7, 8, 9, 10, any range bounded on the lower end by any of these values, or in any range defined by any two of these values). In one example, the ferroelectric oxide material includes $ZrHfO_x$, and the molar ratio between Zr and Hf is 1. In another example, the ferroelectric oxide material includes TiHfOX, and the molar ratio between Ti and Hf is 1. In some embodiments, the ferroelectric oxide material includes oxygen and a non-metal material such as silicon.

Doped ferroelectric layer 114 may also include a plurality of dopants formed as a part of the crystal structures. In some embodiments, the dopants compensate the defects formed during the crystallization of the ferroelectric oxide material to improve the film quality of doped ferroelectric layer 114. Elements of one or more groups, e.g., in the periodic table, can be selected as dopants based on their physical and/or chemical properties. In some embodiments, elements are chosen for optimizing the compensation of defects in doped ferroelectric layer 114.

In some embodiments, the dopants are different from the ferroelectric metals in the ferroelectric oxide material and include one or more dopants from one or more of Group II elements (e.g., calcium (Ca), strontium (Sr), or barium (Ba)), Group III elements (e.g., scandium (Sc), yttrium (Y), aluminum (Al), gallium (Ga), and indium (In)), and Lanthanide elements (i.e., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu)). The dopants can be distributed along a concentration gradient in a desired depth range along a vertical direction (e.g., the z-axis). For ease of description, a depth range is described to be between a first level and a second level of doped ferroelectric layer 114 along the vertical direction. For ease of description, in the present disclosure, a concentration gradient refers to a gradual decrease of doping concentration from the first level to the second level of doped ferroelectric layer 114. In some embodiments, the dopant concentrations of the first level and the second level are different. In some embodiments, the dopant concentrations of the first level and the second level are the same. In some embodiments, dopants may be distributed in a plurality of concentration gradient/profiles in doped ferroelectric layer 114, e.g., along the vertical direction or the direction perpendicular to the surface of doped ferroelectric layer 114. The doping concentrations at the first level of a concentration gradient may be the same as or different from the doping concentration at the first level of another concentration gradient, and the doping concentrations at the second level of a concentration gradient may be the same as or different from the doping concentration at the second level of another concentration gradient. The dopants can be distributed in any suitable doping profiles (e.g., an exponential doping profile, a parabolic doping profile, or a linear doping profile) in doped ferroelectric layer 114 and the doping concentration can thus accordingly vary as a function of depth in doped ferroelectric layer 114. In doped ferroelectric layer 114, doping profiles can be the same in different depth ranges or can vary (e.g., from one level to another level or from one surface to another surface). The specific types of doping profile in doped ferroelectric layer 114 should not be limited by the embodiments of the present disclosure. One exemplary doping profile is shown in FIG. 1. The dopants may be distributed along a concentration gradient from the upper surface (e.g., the first level) to the lower surface (e.g., the second level), as depicted by the arrow. That is, the doping concentration gradually decreases from the upper surface to the lower surface of doped ferroelectric layer 114. In some embodiments, the doping concentration can range from about $10^{17}$-$10^{21}$/cm$^3$ (e.g., at the upper surface of doped ferroelectric layer 114) to about $10^{21}$-$10^{17}$/cm$^3$ (e.g., at the lower surface of doped ferroelectric layer 114), or vice versa.

Doped ferroelectric layer 114 may include binary dopants, e.g., a first group of dopants and a second group of dopants different from the first group of dopants. In some embodiments, the first group of dopants include at least one dopant from Group IV elements, and the second group of dopants includes at least one dopant from one or more of Group V elements, Group II elements, Group III elements, and Lanthanide elements. In some embodiments, the first group of dopants include at least one of Zr, Hf, or Ti. The first group of dopants are different from the ferroelectric metals in the ferroelectric oxide material. In one example, if the ferroelectric oxide material includes $Zr_xHf_yO_z$ (e.g., $ZrHfO_z$, where x=y=1), then the first group of dopants include Ti, but not Zr or Hf. In another example, if the ferroelectric oxide material includes $Ti_xHf_yO_z$ (e.g., $TiHfO_z$, where x=y=1), then the first group of dopants include Zr, but not Ti or Hf. In some embodiments, the second group of dopants include at least one of tantalum (Ta), niobium (Nb), dubnium (Db), vanadium (V), Sc, Y, Al, Ga, In, lanthanides, Ca, Sr, or Ba. In some embodiments, a molar ratio between the first group of dopants and the second group of dopants is between about 100:1 to about 1:100, e.g., 100:1, 90:1, 80:1, 50:1, 25:1, 10:1, 5:1, 1:1, 1:5, 1:10, 1:25, 1:50, 1:80, 1:90, 1:100, any range bounded on the lower end by any of these values, or in any range defined by any two of these values. Binary dopants can significantly improve a ferroelectric memory device's performance, reduce ferroelectric layer thickness and anneal temperature, allowing more freedom in terms of memory circuit design. A carefully designed doping gradient can improve ferroelectric features such as the switching charge, fatigue, imprint, and/or retention of the ferroelectric memory device.

In some embodiments, the first group of dopants include at least one dopant from Group V elements, and the second group of dopants include at least one dopant from one or more of Group II elements, Group III elements, and Lanthanide elements. In some embodiments, the first group of dopants include at least one of Ta, Nb, Db, or V. In some embodiments, the second group of dopants include at least one of Sc, Y, Al, Ga, In, lanthanides, Ca, Sr, or Ba. In some embodiments, a molar ratio between the first group of dopants and the second group of dopants is between about 100:1 to about 1:100.

In some embodiments, the first group of dopants include at least one dopant from Group III elements and Lanthanide elements, and the second group of dopants include at least one dopant from one or more of Group II elements. In some embodiments, the first group of dopants include at least one of Sr, Y, or lanthanides. In some embodiments, the second group of dopants include at least one of Ca, Sr, or Ba. In some embodiments, a molar ratio between the first group of dopants and the second group of dopants is between about 100:1 to about 1:100. For example, a molar ratio between the Group III dopants and Group II dopants can be about 1:1.

In some ferroelectric memory devices, their ferroelectric films can lose orthorhombic crystalline structure when the thickness of the films are below 5 nm due to the inability of the films to crystallize regardless of the added post annealing conditions. As described above, the dopants disclosed herein can improve the crystallization of ferroelectric oxide material, for example, by compensating the defects formed during the crystallization process. Thus, in some embodiments, the thickness of ferroelectric layer is between about 1 nm and about 5 nm, such as between 1 nm and 5 nm (e.g., 1 nm, 1.5 nm, 2 nm, 2.5 nm, 3 nm, 3.5 nm, 4 nm, 4.5 nm, 5 nm, any range bounded on the lower end by any of these values, or in any range defined by any two of these values).

In some embodiments, transistor 104 includes source/drain regions 120 and a gate stack having a gate dielectric 122 and a gate conductor 124. Source/drain regions 120 can be doped regions in substrate 108 with n-type or p-type dopants at a desired doping level. Gate dielectric 122 can include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 124 can include conductive materials including, but not limited to, tungsten (W), cobalt (Co), copper (Cu), aluminum (Al), polysilicon, silicides, or any combination thereof. Gate conductor 124 can function as the word line of ferroelectric memory cell 100. An interconnect (not shown) can be in contact with one of source/drain regions 120 that is not in contact with interconnect 106 and function as the bit line of ferroelectric memory cell 100.

The dopants may also be distributed in other suitable doping profiles in doped ferroelectric layer 114. In some embodiments, the doping profiles of the dopants are determined based on factors such as the crystallization process and/or material properties of the ferroelectric oxide material. FIGS. 2A-2E each illustrates a cross-sectional view of an exemplary doping profile in doped ferroelectric layer 114, according to some embodiments. The arrow next to each cross-sectional view depicts the direction of the concentration gradient (e.g., the direction along which the doping concentration decreases). Doped ferroelectric layer 114 shown in FIGS. 2A-2E may have a suitable combination of the first and the second groups of dopants as doped ferroelectric layer 114 illustrated in FIG. 1. Details of the possible elements used as the first group of dopants and the second group of dopants in doped ferroelectric layers 114 of FIGS. 2A-2E can be referred to as the description of dopants in doped ferroelectric layer 114 in FIG. 1 and thus, are not repeated herein.

Figure 2A:
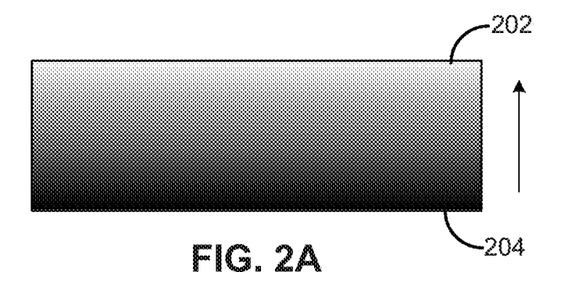
FIGS. 2A-2E each illustrates a cross-section of an exemplary doped ferroelectric layer, according to some embodiments of the present disclosure.

As an example shown in FIG. 2A, the first level may refer to a lower surface 204 of doped ferroelectric layer 114, the second level may refer to an upper surface 202 of doped ferroelectric layer 114, and the doping concentration may decrease from lower surface 204 to upper surface 202 of doped ferroelectric layer 114. As indicated by the arrow, the doping concentration can decrease from about $10^{21}$/cm$^3$ (e.g., at lower surface 204) to about $10^{17}$/cm$^3$ (e.g., at upper surface 202). In some embodiments, a molar ratio between the first group of dopants and the second group of dopants is between about 100:1 to about 1:100.

Figure 2B:
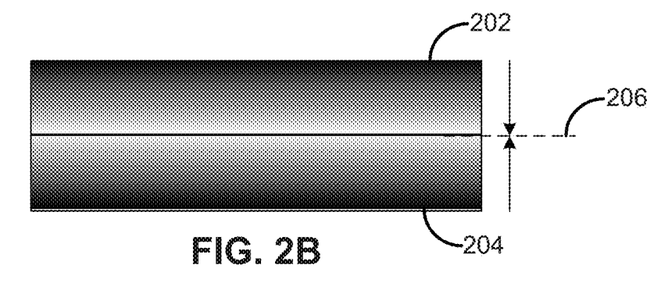

In another example shown in FIG. 2B, the first level may refer to each one of upper surface 202 and lower surface 204 of doped ferroelectric layer 114, and the second level may refer a first middle level 206 of doped ferroelectric layer 114. In the present disclosure, a middle level (e.g., first middle level 206, second middle level 208, and third middle level 210) represents any suitable level/depth/position/surface between an upper boundary (e.g., an upper surface/level) and a lower boundary (e.g., a lower surface/level). That is, a middle level is not necessarily positioned at the exact middle position between two boundaries. The middle level can deviate from the middle position between two boundaries by any desired distance, determined by the actual design/application. For example, first middle level 206 may be any suitable level/depth in doped ferroelectric layer 114 between upper surface 202 and lower surface 204. In some embodiments, first middle level 206 may approximately be the middle position between upper surface 202 and lower surface 204 and may have approximately the same distance to each of upper surface 202 and lower surface 204. In some embodiments, the doping concentration may decrease from each of upper surface 202 and lower surface 204 towards first middle level 206, as indicated by the arrows in FIG. 2B. In some embodiments, the doping concentration decreases respectively from about $10^{21}/cm^3$ (e.g., at upper surface 202) and about $10^{21}/cm^3$ (e.g., at lower surface 204) to about $10^{17}/cm^3$ (e.g., at first middle level 206). In some embodiments, a molar ratio between the first group of dopants and the second group of dopants is between about 100:1 and about 1:100.

Figure 2C:
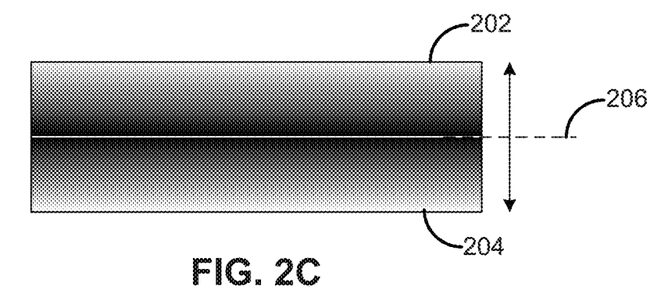

In still another example shown in FIG. 2C, the first level may refer to first middle level 206 of doped ferroelectric layer 114, and the second level may refer to each one of upper surface 202 and lower surface 204 of doped ferroelectric layer 114. In some embodiments, the doping concentration may decrease from first middle level 206 towards each of the upper surface 202 and lower surface 204, as indicated by the arrows in FIG. 2C. In some embodiments, the doping concentration decreases respectively from about $10^{21}/cm^3$ (e.g., first middle level 206) to about $10^{17}/cm^3$ (e.g., at upper surface 202) and to about $10^{17}/cm^3$ (e.g., at lower surface 204). In some embodiments, a molar ratio between the first group of dopants and the second group of dopants is between about 100:1 and about 1:100.

Figure 2D:
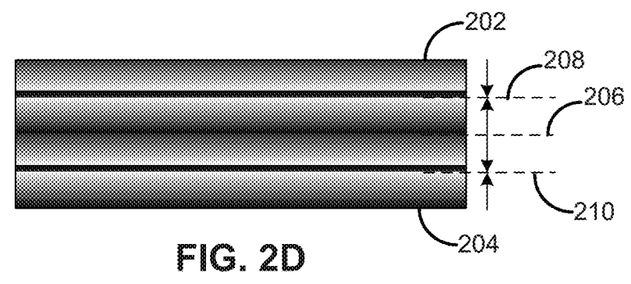

In yet another example shown in FIG. 2D, upper surface 202, first middle level 206, and lower surface 204 may each be a first level, and a middle level between two adjacent first levels may be a second level. For example, second middle level 208 (e.g., between upper surface 202 and first middle level 206) and third middle level 210 (e.g., between lower surface 204 and first middle level 206) may each be a second level. Second middle level 208 may be any suitable depth/level between upper surface 202 and first middle level 206, and third middle level 210 may be any suitable depth/level between first middle level 206 and lower surface 204. In some embodiments, second middle level 208 may be a middle position between upper surface 202 and first middle level 206, and third middle level 210 may be a middle position between first middle level 206 and lower surface 204. For example, second middle level 208 has approximately the same distance to upper surface 202 and first middle level 206, and third middle level 210 has approximately the same distance to first middle level 206 and lower surface 204. In some embodiments, as indicated by the arrows of FIG. 2D, doping concentrations decrease respectively from first middle level 206 towards second middle level 208 and third middle level 210, and from each of upper surface 202 and lower surface 204 towards second middle level 208 and third middle level 210. In some embodiments, the doping concentration decrease respectively from about $10^{21}/cm^3$ (e.g., first middle level 206) to about $10^{17}/cm^3$ (e.g., at second middle level 208) and to about $10^{17}/cm^3$ (e.g., at third middle level 210). In some embodiments, the doping concentration decrease respectively from about $10^{21}/cm^3$ (e.g., at upper surface 202) to about $10^{17}/cm^3$ (e.g., second middle level 208) and from about $10^{21}/cm^3$ (e.g., at lower surface 204) to about $10^{17}/cm^3$ (e.g., at third middle level 210). In some embodiments, a molar ratio between the first group of dopants and the second group of dopants is between about 100:1 and about 1:100.

Figure 2E:
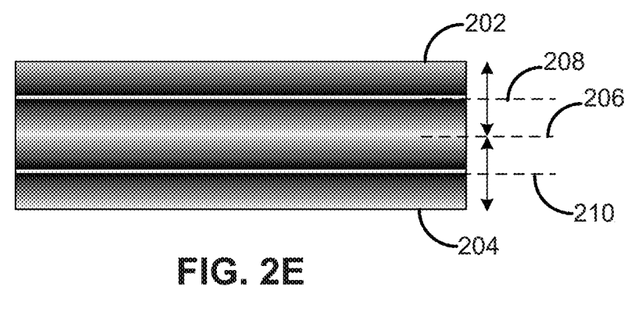

In yet another example shown in FIG. 2E, second and third middle levels 208 and 210 may each be a first level, and upper surface 202, first middle level 206, and lower surface 204 may each be a second level. As shown in FIG. 2E, second and third middle levels 208 and 210 represent different surfaces/depths in doped ferroelectric layer 114, and the doping concentration at second and third middle levels 208 and 210 can be the same or different. In some embodiments, second middle level 208 may be a middle position between upper surface 202 and first middle level 206, and third middle level 210 may be a middle position between first middle level 206 and lower surface 204. In some embodiments, as indicated by the arrows of FIG. 2E, doping concentrations decrease respectively from second middle level 208 and third middle level 210 towards first middle level 206, and respectively from second middle level 208 and third middle level 210 towards each of upper surface 202 and lower surface 204. In some embodiments, the doping concentration decrease respectively from about $10^{21}/cm^3$ (e.g., at second middle level 208) and about $10^{21}/cm^3$ (e.g., at third middle level 210) to about $10^{17}/cm^3$ (e.g., first middle level 206). In some embodiments, the doping concentration decrease respectively from about $10^{21}/cm^3$ (e.g., second middle level 208) to about $10^{17}/cm^3$ (e.g., at upper surface 202) and from about $10^{21}/cm^3$ (e.g., at third middle level 210) to about $10^{17}/cm^3$ (e.g., at lower surface 204). In some embodiments, a molar ratio between the first group of dopants and the second group of dopants is between about 100:1 and about 1:100. For ease of description, the present disclosure only illustrates a limited number of middle levels as examples to show the changes in doping concentration as a function of depth in doped ferroelectric layer 114. In some embodiments, any suitable number of middle levels can be formed in doped ferroelectric layer 114. For example, the number of middle levels can be greater than 10, depending on the design/application. The specific number and locations of middle levels should not be limited by the embodiments of the present disclosure.

Figure 3A:
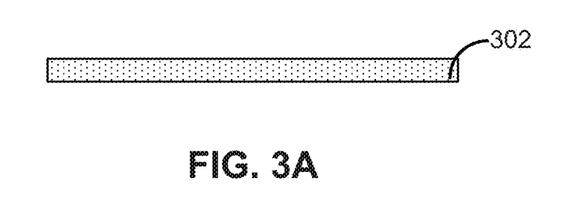
FIGS. 3A-3C illustrate an exemplary fabrication process for forming a ferroelectric memory cell, according to some embodiments of the present disclosure.

FIGS. 3A-3C and FIGS. 3D-3G each illustrates an exemplary fabrication process (e.g., 300 and 320) to form a doped ferroelectric layer in contact with electrodes in a ferroelectric memory cell, according to some embodiments. FIG. 4 illustrates a flowchart of a method 400 for forming the doped ferroelectric layer in contact with electrodes. Examples of the doped ferroelectric layer formed by processes 300 and 320 include doped ferroelectric layers 114 depicted in FIG. 1. For ease of illustration, processes 300 and 320 are described together with FIG. 4. It should be understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a first electrode is formed. As illustrated in FIG. 3A, a lower electrode 302 is formed, for example, in an interlayer dielectric (ILD) layer (not shown). Similarly, as illustrated in FIG. 3D, a lower electrode 322 is formed, for example, in an ILD layer (not shown). Lower electrode 302/322 can include a conductive layer deposited using at least one of physical vapor deposition (PVD), chemical vapor deposition (CVD), electrochemical deposition, atomic layer deposition (ALD), and pulsed laser deposition (PLD). The thickness of lower electrode 302/322 can be between 2 nm and 50 nm. Fabrication processes to form the conductive layer can also include photolithography, chemical mechanical polishing (CMP), wet/dry etch, or any combination thereof. The ILD layer can include dielectric materials deposited by one or more thin film deposition processes including, but not limited to, CVD, PLD, ALD, sol-gel process, MOCVD, CSD, or any combination thereof.

Method 400 proceeds to operation 404, as illustrated in FIG. 4, in which a doped ferroelectric layer is formed in contact with the first electrode. In some embodiments, the doped ferroelectric layer is formed above the first electrode.

Figure 3B:
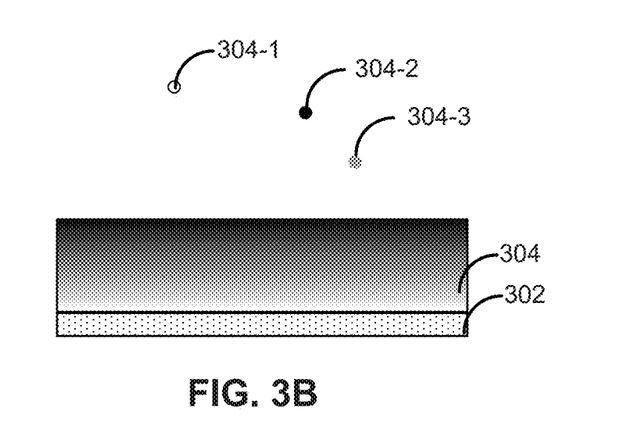
Figure 4:
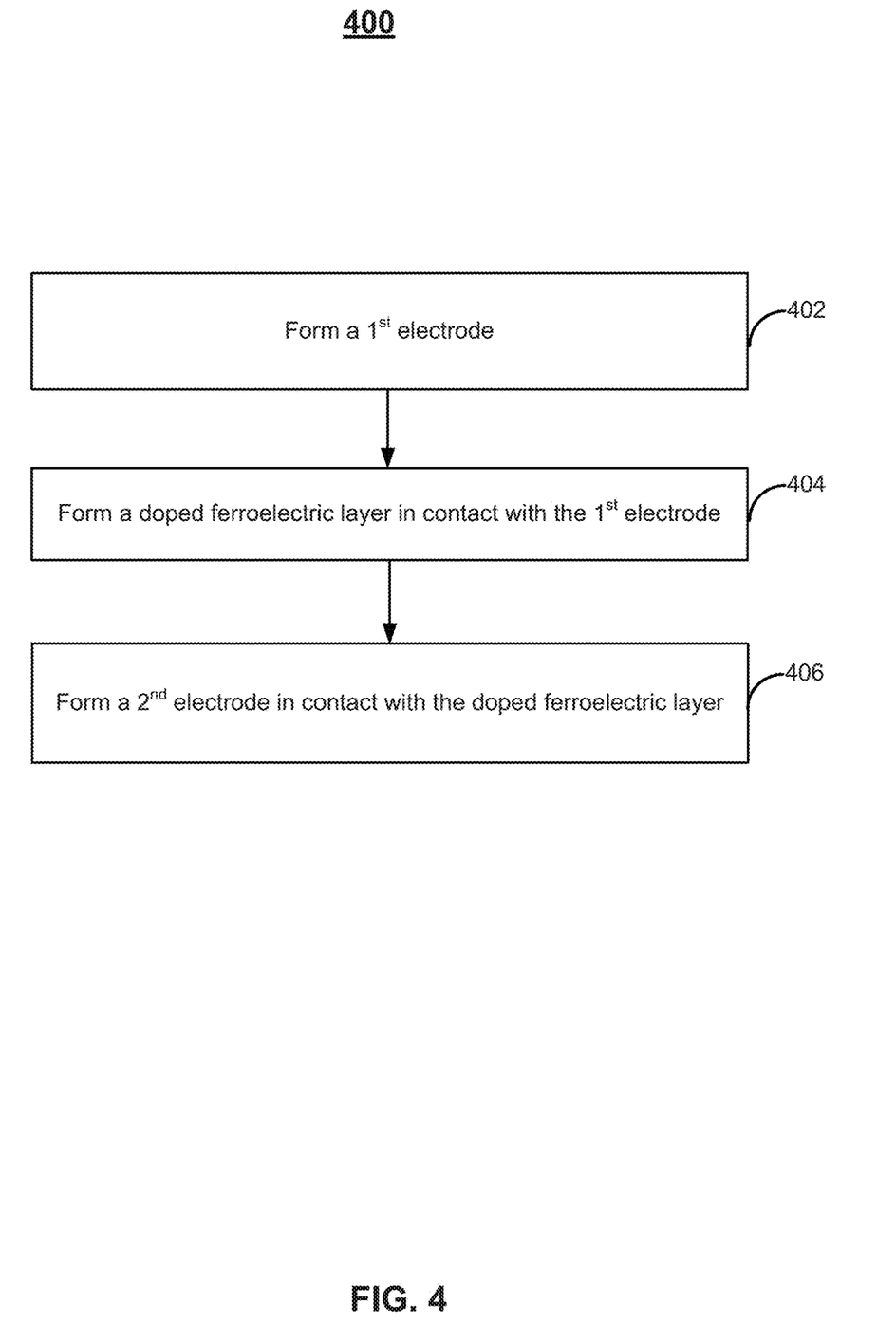
FIG. 4 is a flowchart of an exemplary method for forming a ferroelectric memory cell, according to some embodiments of the present disclosure.

FIG. 3B illustrates an operation to form a doped ferroelectric layer 304 using an in-situ doping method. As illustrated in FIG. 3B, doped ferroelectric layer 304 is formed above and in contact with lower electrode 302. Doped ferroelectric layer 304 can include a dielectric material (e.g., ferroelectric oxide material). The dielectric material can include, but not limited to, oxygen and one or more ferroelectric metals, such as Zr, Hf, and Si. The dielectric material can be doped with dopants having at least one dopant from one of Group II elements, Group III elements, and Lanthanide elements. The thickness of doped ferroelectric layer 304 can be between 1 nm and 50 nm, such as between 1 nm and 5 nm. In some embodiments, depending on the design/application, portions of doped ferroelectric layer 304 (e.g., at different depth ranges) can be formed by different deposition methods. For example, half of doped ferroelectric layer 304 can be formed by a CVD process, and the rest of doped ferroelectric layer 304 can be subsequently formed by PVD. The specific processes to form ferroelectric layer 304 should not be limited by the embodiments of the present disclosure.

In some embodiments, the dielectric material is deposited using a CVD process under a temperature between about 20° C. and about 600° C., such as between 20° C. and 600° C. (e.g., 20° C., 40° C., 60° C., 80° C., 100° C., 200° C., 300° C., 400° C., 500° C., 600° C., any range bounded on the lower end by any of these values, or in any range defined by any two of these values). For example, the CVD process uses reactant gases with a deposition temperature between room temperature and 600° C. In some embodiments, the reactant gases include vaporized precursor gases. The reactant gases can include at least one of Hf-containing compound, Zr-containing compound, or Si— containing compound. In one example, the reactant gases include at least one of a Hf-containing reactant gas and a Zr-containing reactant gas. Dopant reactant gases having the dopant elements (e.g., Ti and Ta) may also be introduced into the reactor during the reaction to form the dielectric material. Dopant reactant gases may be mixed with the reactant gases to form the dielectric material during the deposition such that the dopants can be distributed in the subsequently-formed doped ferroelectric layer 304 with a desired doping profile. In some embodiments, the flow rates of the dopant reactant gases can be adjusted such that desired doping concentration can be reached at a desired depth in the subsequently-formed doped ferroelectric layer 304. For example, a higher flow rate can result in a higher doping concentration, and vice versa. For illustration purposes, in FIG. 3B, element 304-1 represents one or more reactant gas molecules for forming the dielectric material, element 304-2 represents one or more dopant reactant gas molecules for forming the first group of dopants, and element 304-3 represents one or more dopant reactant gas molecules for forming the second group of dopants. The flow rates of elements 304-2 and 304-3 may be dynamically adjusted such that the dopants can be distributed in subsequently-formed doped ferroelectric layer 304 in a desired doping profile. In some embodiments, the molar ratio of elements 304-2 and 304-3 can be adjusted by tuning the flow rates of elements 304-2 and 304-3. Fabrication processes to form the dielectric layer can also include photolithography, CMP, wet/dry etch, or any combination thereof.

In some embodiments, the dielectric material is deposited using an ALD process under a temperature between about 20° C. and about 600° C., such as between 20° C. and 600° C. For example, the ALD process uses a precursor with a deposition temperature between room temperature and 600° C. The precursors can include at least one of Hf-containing compound, Zr-containing compound, or Si-containing compound. In one example, the precursors include at least one of a Hf-containing compound, a Zr-containing compound, and at least one dopant-containing precursor (e.g., Ta and Ti). The Hf-containing compound and the Zr-containing compound can share the same ligand. For example, the precursors are in liquid phase or in solid phase at the room temperature. The precursors can be introduced into the reactor in a desired sequence so that the dopants are distributed into desired depths of doped ferroelectric layer 304, forming a desired doping profile. Fabrication processes to form the dielectric layer can also include photolithography, CMP, wet/dry etch, or any combination thereof.

In some embodiments, the dielectric material is deposited using a PVD process under a temperature between about 0° C. and about 600° C., such as between 20° C. and 300° C. In some embodiments, a target containing the dielectric material (e.g. ferroelectric oxide material $HfO_x$) with desired binary dopants (e.g. $HfZrTiO_x$) is sputtered and deposited onto a substrate to form a doped ferroelectric layer 304. A reactant gas (such as oxygen) is used along with an inert gas (e.g. Ar) to achieve desired composition in doped ferroelectric layer 304. In some embodiments, a plurality of targets (e.g., Hf, Zr and Ti) are placed in a PVD chamber, and with a reactant gas (e.g. oxygen) and/or an inert gas (e.g. Ar) is injected into the PVD chamber to form doped ferroelectric layer 304. A desired doping profile and stoichiometry are obtained by controlling the PVD chamber pressure, the flow rate of the reactant gas, the flow rate of the inert gas, the sputter rates of each target, the PVD chamber temperature, and the sputter sequence of each target. In some embodiments, a target containing the dielectric material (e.g., a ferroelectric oxide material such as $HfO_x$) and a target containing dopant atoms (e.g., Ti and Zr) sputtered and deposited simultaneously or sequentially onto a substrate to form a doped ferroelectric layer 304. The chamber pressure, sputter rates of each target, chamber temperature, sputter times of each target, and the sputter sequence of each target can be controlled so that the dopants are distributed into desired depths of doped ferroelectric layer 304, forming a desired doping profile. Fabrication processes to form the dielectric layer can also include photolithography, CMP, wet/dry etch, or any combination thereof.

Figure 3C:
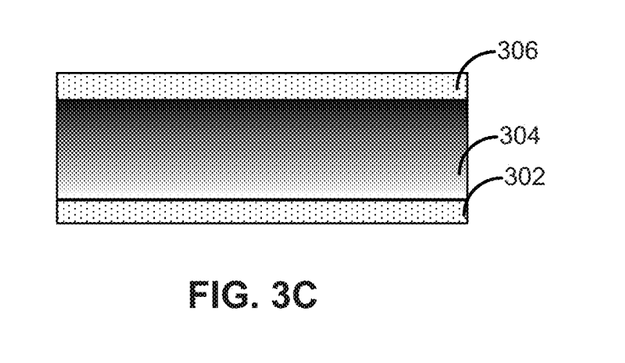
Figure 3D:
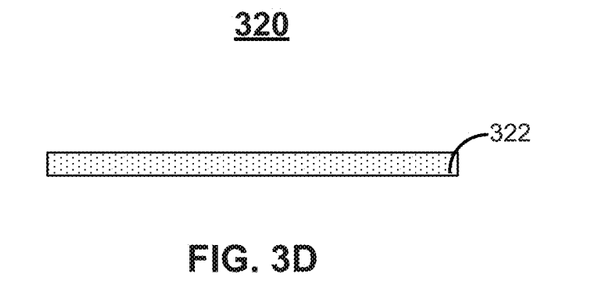
FIGS. 3D-3G illustrate another exemplary fabrication process for forming a ferroelectric memory cell, according to some embodiments of the present disclosure.
Figure 3E:
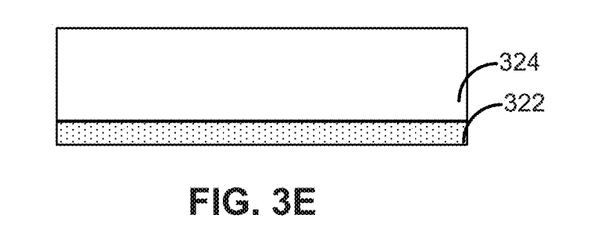
Figure 3F:
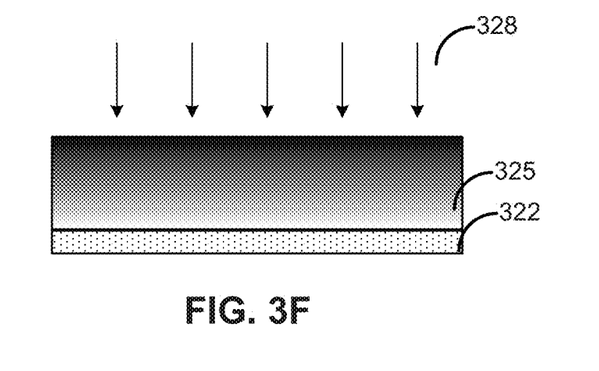

FIGS. 3E and 3F illustrate an operation to form a doped ferroelectric layer 325 using an ion implantation process. As illustrated in FIG. 3F, doped ferroelectric layer 325 is formed above and in contact with lower electrode 322. Dielectric material 324 may be first formed using one or more of CVD, PLD, ALD, sol-gel process, MOCVD, CSD process, or any combination thereof. Different from the CVD, ALD, or PLD processes described above for forming doped ferroelectric layer 304, no dopant-containing reactant gases (e.g., for forming the first and second groups of dopants) are introduced during the deposition process of dielectric material 324. An ion implantation process 328 may then be performed on dielectric material 324 to form the first and second groups of dopants. Doped ferroelectric layer 325 may then be formed. In some embodiments, ions for forming the first and the second groups of dopants (e.g., depicted as the arrows) are mixed and implanted into dielectric material 324 at the same time. In some embodiments, ions for forming the first and the second groups of dopants may be separately implanted into dielectric material 324. The dosages and implantation energy of ions can be controlled such that the dopants can have a desired doping profile in subsequently-formed doped ferroelectric layer 325. In some embodiments, a thermal annealing process is performed after the ion implantation to further change/adjust the doping profile in subsequently-formed doped ferroelectric layer 325 to activate and redistribute dopants into the lattice of dielectric material 324, compensating the defects caused by ion implantation process 328. In some embodiments, other suitable doping methods, such as plasma doping (e.g., in which one or more targets are biased and bombarded so dopant ions implanted into dielectric material 324) and thermal diffusion (e.g., in which dopants are deposited and driven into dielectric material 324 to form desired doping profile) can also be used to form desired doping profiles in doped ferroelectric layer 325.

In some embodiments, various doping methods can be combined to form a ferroelectric layer with desired doping profiles. In some embodiments, different doping methods can be combined, e.g., used simultaneously, sequentially, or alternately, to form desired doping profiles in the doped ferroelectric layer. Different doping methods can also be performed for the doping of one group of dopants or a single dopant element. In some embodiments, the first and the second groups of dopants are formed using different doping methods. For example, the first group of dopants can be formed by one or more of CVD, PLD, ALD, sol-gel process, MOCVD or CSD process, and the second group of dopants can be formed by ion implantation, and vice versa. In some embodiments, doping profiles in different depths ranges can be formed using the same doping method or different methods. Using doped ferroelectric layer 114 shown in FIG. 2B as an example, doping profile between lower surface 204 and first middle level 206 can be formed by CVD, and doping profile between first middle level 206 and upper surface 202 can be formed by CVD and/or IMP.

Figure 3G:
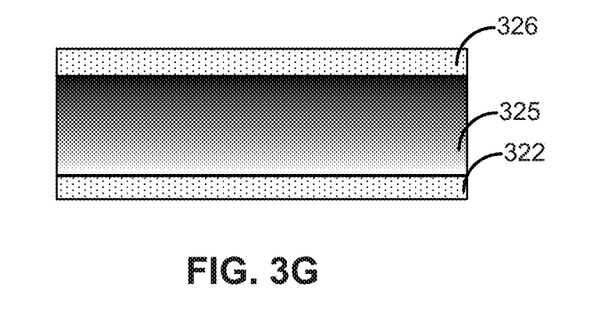

Method 400 proceeds to operation 406, as illustrated in FIG. 4, in which a second electrode is formed in contact with the doped ferroelectric layer. As illustrated in FIG. 3C, an upper electrode 306 is formed above and in contact with doped ferroelectric layer 304. Similarly, as illustrated in FIG. 3G, an upper electrode 326 is formed above and in contact with doped ferroelectric layer 325. Upper electrode 306/326 can include a conductive layer deposited using at least one of PVD, CVD, electrochemical deposition, PLD, chemical vapor deposition, and ALD. The thickness of upper electrode 306/326 can be between 2 nm and 50 nm. Fabrication processes to form the dielectric layer can also include photolithography, CMP, wet/dry etch, or any combination thereof.

Figure 5:
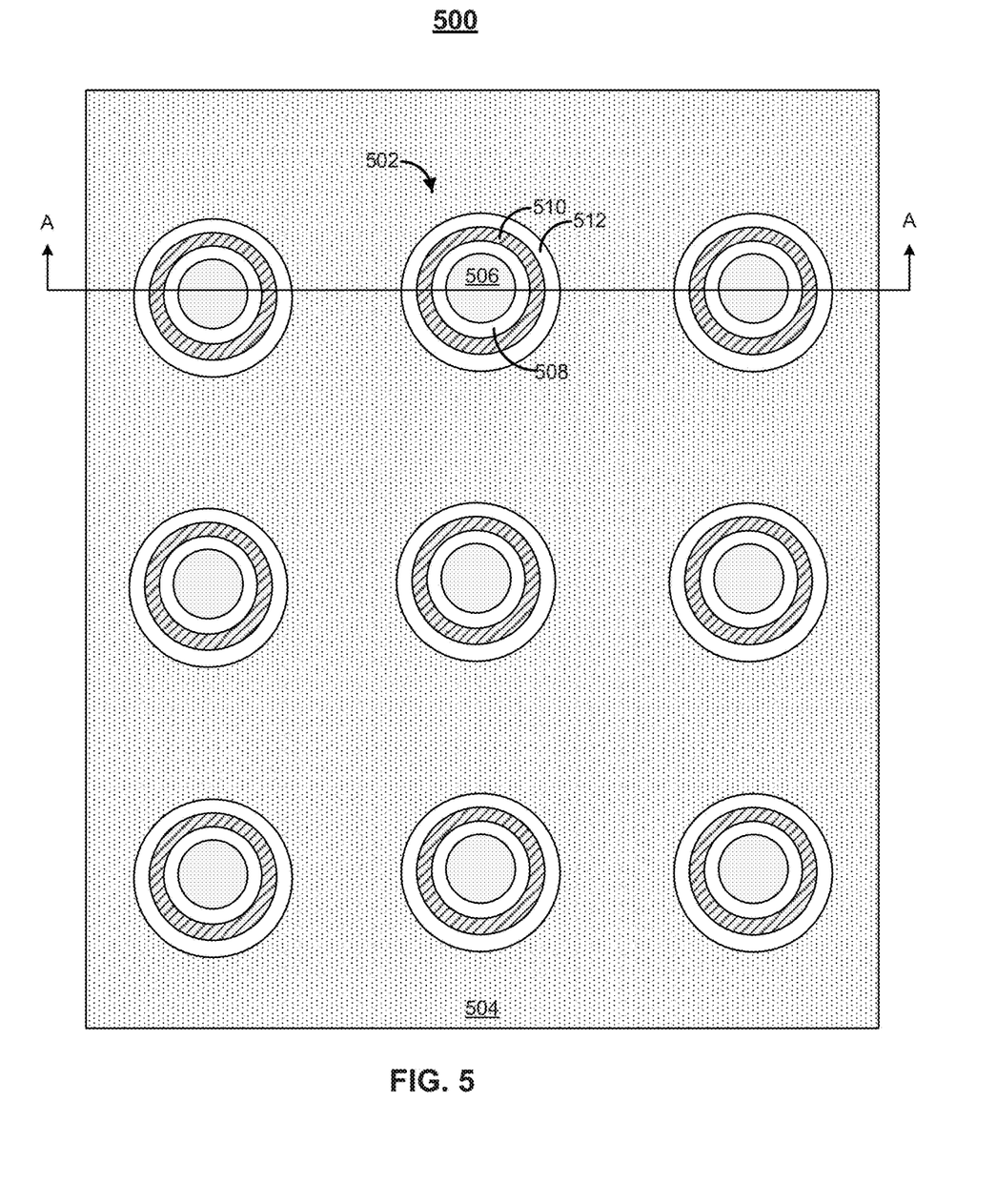
FIG. 5 illustrates a plan view of an exemplary ferroelectric memory device, according to some embodiments of the present disclosure.

FIG. 5 illustrates a plan view of an exemplary ferroelectric memory device 500, according to some embodiments of the present disclosure. Ferroelectric memory cell 100 is part of a planar ferroelectric memory device in which the ferroelectric layer is doped with at least two groups of dopants. The similar doped ferroelectric layer can be implemented into 3D ferroelectric memory devices, such as ferroelectric memory device 500, to improve the ferroelectric properties and memory cell array density.

Ferroelectric memory device 500 can include an array of ferroelectric memory strings 502 disposed in one or more ILD layers 504 and extending vertically above a substrate (not shown). Each ferroelectric memory string 502 has a circular shape in the plan view and includes a conductor layer 506, a first electrode 508, a doped ferroelectric layer 510, and a second electrode 512 disposed radially from the center of ferroelectric memory string 502 in this order. That is, doped ferroelectric layer 510 can be disposed radially between first electrode 508 and second electrode 512. Conductor layer 506 fills the remaining area inside first electrode 508 and includes a conductor material, such as a metal. It is understood that the shape of ferroelectric memory string 502 in the plan view is not limited to circular and can be any other shapes, such as rectangular, square, oval, etc.

Figure 6:
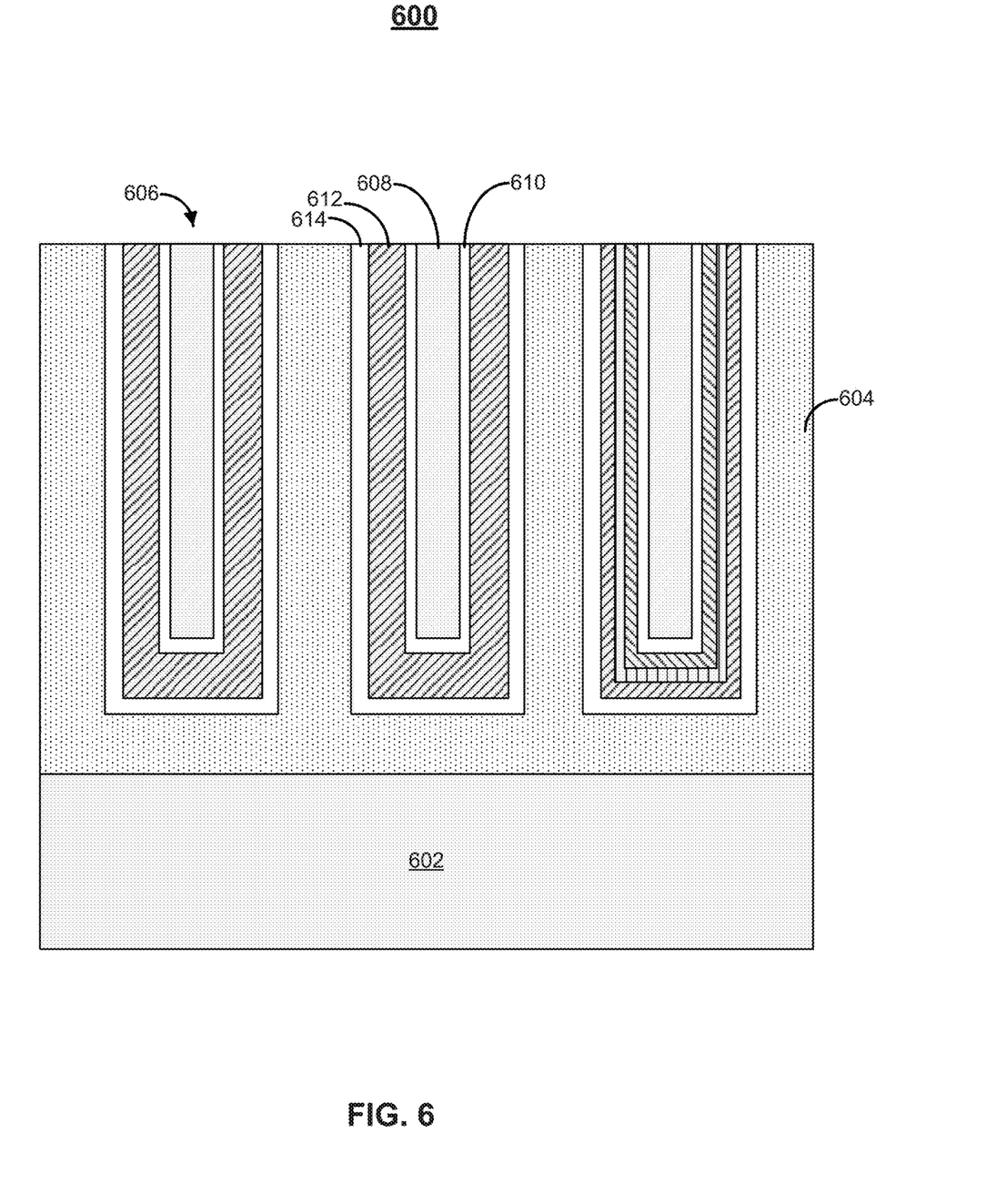
FIG. 6 illustrates a cross-section of an exemplary ferroelectric memory device, according to some embodiments of the present disclosure.

FIG. 6 illustrates a cross-section of an exemplary ferroelectric memory device 600, according to some embodiments of the present disclosure. In some embodiments, FIG. 6 illustrates the cross-section of ferroelectric memory device 500 along A-A direction. As shown in FIG. 6, ferroelectric memory device 600 includes a substrate 602 and one or more ILD layers 604 disposed above substrate 602. Ferroelectric memory device 600 can also include a plurality of ferroelectric memory strings 606 extending vertically through ILD layers 604 and above substrate 602. In some embodiments, ferroelectric memory device 600 is electrically connected to a transistor via an interconnect (the transistor and the interconnect are not shown in FIG. 6).

Each ferroelectric memory string 606 can have a cylinder shape (e.g., a pillar shape). A conductor layer 608, a first electrode 610, a doped ferroelectric layer 612, and a second electrode 614 can be disposed laterally (e.g., radially) from the center of ferroelectric memory string 606 in this order. Doped ferroelectric layer 612 may be similar to doped ferroelectric layer 114 described above in detail in FIG. 1 except being rotated right or left 90 degrees. Doped ferroelectric layer 612 can be disposed radially between first electrode 610 and second electrode 614. The doping profile of doped ferroelectric layer 612 may be similar to those examples described above in detail in FIGS. 2A-2E except being rotated right or left 90 degrees.

In some embodiments, each of first electrode 610 and second electrode 614 includes at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), ruthenium oxide (RuOx), iridium (Ir), doped polysilicon, transparent conductive oxides (TCOs), or iridium oxide (IrOx). In some embodiments, each of first electrode 610 and second electrode 614 has the thickness (in the radial direction) of between 2 nm and 50 nm.

To fabricate each ferroelectric memory string 606, a vertical opening (e.g., a hole or a trench) can be etched through one or more ILD layers 604 using wet etch and/or dry etch. Second electrode 614, doped ferroelectric layer 612, and first electrode 610 can be sequentially deposited opening this order into the vertical opening to cover the sidewalls and bottom of the vertical opening using one or more thin film deposition processes, such as PVD, CVD, electrochemical deposition, ALD, and any combination thereof. Doped ferroelectric layer 612 may be formed using the similar processes described above for forming doped ferroelectric layer 304 or 325. Conductor layer 608 can be deposited afterwards to fill the remaining space in the vertical opening. In some embodiments, conductor layer 608 partially fills the space in the vertical opening, and a dielectric structure (not shown) can be deposited to fill up the rest of the space in the vertical opening.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of forming a ferroelectric memory cell, comprising:
    forming a first electrode;
    forming a doped ferroelectric layer in contact with the first electrode, the doped ferroelectric layer comprising (i) oxygen and one or more ferroelectric metals, (ii) a first group of dopants comprising at least a first dopant from one of Group III elements, Group IV elements, Group V elements, or Lanthanide elements, the first group of dopants being different from the one or more ferroelectric metals, and (iii) a second group of dopants comprising at least a second dopant from one of Group II elements, the Group III elements, the Group V elements, or the Lanthanide elements, the second group of dopants being different from the one or more ferroelectric metals, wherein the first group of dopants and the second group of dopants are different group elements; and
    forming a second electrode in contact with the doped ferroelectric layer,
    wherein the first group of dopants and the second group of dopants are distributed along a concentration gradient from a first level of the doped ferroelectric layer to a second level of the doped ferroelectric layer,
    wherein the first level of the doped ferroelectric layer comprises a first surface in contact with the first electrode, a second surface in contact with the second electrode, and a first middle level of the doped ferroelectric layer, a dopant concentration at the first surface is the same as a dopant concentration at the first middle level, and
    wherein the second level of the doped ferroelectric layer comprises a second middle level of the doped ferroelectric layer between the first surface and the first middle level, and a third middle level of the doped ferroelectric layer between the second surface and the first middle level, a dopant concentration at the second middle level is different from the dopant concentration at the first surface and is the same as the dopant concentration at the third middle level.

2. The method of claim 1, wherein forming the doped ferroelectric layer comprises at least one of an in-situ doping process, an ion implantation process, a thermal diffusion process, or a plasma doping process.

3. The method of claim 2, wherein forming the doped ferroelectric layer comprises performing the in-situ doping process in at least one of a chemical vapor deposition (CVD) process, a pulsed laser deposition (PLD) process, an atomic layered deposition (ALD) process, a sol-gel process, a metal-organic chemical vapor deposition (MOCVD) process, or a chemical solution deposition (CSD) process, the in-situ doping process being performed in-situ in a same process chamber where the doped ferroelectric layer is formed.

4. The method of claim 2, wherein forming the doped ferroelectric layer comprises:
    performing at least one of the ion implantation process, the thermal diffusion process, or the plasma doping process to dope a plurality of dopants into the doped ferroelectric layer after the doped ferroelectric layer is deposited.

5. The method of claim 4, wherein forming the doped ferroelectric layer comprises performing at least one of a chemical vapor deposition (CVD), a pulsed laser deposition (PLD), an atomic layered deposition (ALD), a sol-gel process, a metal-organic chemical vapor deposition (MOCVD), or a chemical solution deposition (CSD).

6. The method of claim 1, wherein a molar ratio between the first group of dopants and the second group of dopants is between about 100:1 and about 1:100.

7. The method of claim 1, wherein the first group of dopants comprise at least the first dopant from the Group IV elements, and the second group of dopants comprise at least the second dopant from one or more of the Group V elements, the Group II elements, the Group III elements, or the Lanthanide elements.

8. The method of claim 7, wherein the first group of dopants comprise at least one of zirconium (Zr), hafnium (Hf), titanium (Ti), or silicon (Si), and the second group of dopants comprise at least one of tantalum (Ta), niobium (Nb), dubnium (Db), vanadium (V), scandium (Sc), yttrium (Y), aluminum (Al), gallium (Ga), indium (In), lanthanides, calcium (Ca), strontium (Sr), or barium (Ba).

9. The method of claim 1, wherein the first group of dopants comprise at least the first dopant from the Group V elements, and the second group of dopants comprise at least the second dopant from one or more of the Group II elements, the Group III elements, or the Lanthanide elements.

10. The method of claim 9, wherein the first group of dopants include at least one of Ta, Nb, Db, or V, and the second group of dopants include at least one of Sc, Y, Al, Ga, In, lanthanides, Ca, Sr, or Ba.

11. The method of claim 1, wherein the first group of dopants comprise at least one dopant from the Group III elements or the Lanthanide elements, and the second group of dopants comprise at least one dopant from one or more of the Group II elements.

12. The method of claim 11, wherein the first group of dopants include at least one of Sr, Y, Al, Ga, In, or lanthanides, and the second group of dopants include at least one of Ca, Sr, or Ba.

13. The method of claim 1, wherein a thickness of the doped ferroelectric layer is between 1 nm and 5 nm.

14. The method of claim 1, wherein one or more of the first electrode and the second electrode comprises at least one of titanium nitride (TiN), titanium silicon nitride (TiSiN$_x$), titanium aluminum nitride (TiAlN$_x$), titanium carbon nitride (TiCN$_x$), tantalum nitride (TaN$_x$), tantalum silicon nitride (TaSiN$_x$), tantalum aluminum nitride (TaAlN$_x$), tungsten nitride (WN$_x$), tungsten silicide (WSi$_x$), tungsten carbon nitride (WCN$_x$), ruthenium (Ru), ruthenium oxide (RuO$_x$), iridium (Ir), doped polysilicon, transparent conductive oxides (TCO), or iridium oxide (IrO$_x$).

15. The method of claim 14, wherein the one or more of the first electrode and the second electrode includes the TCO, which includes at least one of doped ZnO based TCOs, doped TiO$_2$ based TCOs, doped SnO$_2$ based TCOs, or perovskite TCOs.

16. The method of claim 15, wherein the one or more of the first electrode and the second electrode includes La$_{1-x}$Sr$_x$CrO$_3$ (LSCO).

17. The method of claim 1, wherein the dopant concentration increases from the second middle level to the first surface and the first middle level, and increases from the third middle level to the second surface and the first middle level.

18. The method of claim 1, wherein the dopant concentration decreases from the second middle level to the first surface and the first middle level, and decreases from the third middle level to the second surface and the first middle level.

19. The method of claim 1, wherein at least one of the first group of dopants comprises Gallium (Ga).

20. The method of claim 1, wherein the first group of dopants and the second group of dopants comprises at least one of the following:
- the first group of dopants comprise at least the first dopant from the Group III elements, and the second group of dopants comprise at least the second dopant from the Group V elements;
- the first group of dopants comprise at least the first dopant from the Group IV elements, and the second group of dopants comprise at least the second dopant from the Group V elements;
- the first group of dopants comprise at least the first dopant from the Group IV elements, and the second group of dopants comprise at least the second dopant from the Group III elements; or
- the first group of dopants comprise at least the first dopant from the Group V elements, and the second group of dopants comprise at least the second dopant from the Group III elements.

* * * * *